US006113397A

United States Patent [19]

Myers

[11] Patent Number: 6,113,397

[45] Date of Patent: Sep. 5, 2000

[54] COAXIAL CONNECTORS MOUNTED BACK-TO-BACK ON BACKPLANE

[75] Inventor: Dale Bruce Myers, Pasadena, Calif.

[73] Assignee: General Instrument Corporation, Horsham, Pa.

[21] Appl. No.: 09/248,144

[22] Filed: Feb. 10, 1999

[51] Int. Cl.[7] ........................ H05K 1/00

[52] U.S. Cl. ........................ 439/63; 439/581

[58] Field of Search ........................ 439/63, 578, 579, 439/580, 581, 582, 583, 584, 585

[56] References Cited

U.S. PATENT DOCUMENTS 4,231,003 10/1980 Ishimaru ........................ 333/33
5,961,349 10/1999 Paagman ........................ 439/607

*Primary Examiner*—Paula Bradley
*Assistant Examiner*—Ross Gushi
*Attorney, Agent, or Firm*—Edward W. Callan

[57] ABSTRACT

A DIN press-fit coaxial connector having a press-fit center pin and a modified BNC coaxial connector having a hollow center pin are mounted back-to-back on opposite sides of a backplane with the respective center pins of the two coaxial connectors aligned along the same linear axis and in conductive press-fit engagement with each other within a waveguide defined by a conductive-material-coated center hole in the backplane. The diameter of the center hole is dimensioned in relation to the outside diameter of a cylindrical hollow portion of the center pin of the modified BNC coaxial connector to impedance match the connection between the modified BNC coaxial connector and the DIN press-fit coaxial connector. The center hole in the backplane is empty and thereby has the dielectric constant of air, which enables the diameter of the center hole to be small enough that first and second sets of apertures can be disposed in the backplane outside the boundary of the center hole for receiving the respective sets of mounting pins of the DIN press-fit coaxial connector and the modified BNC coaxial connector.

17 Claims, 2 Drawing Sheets

COAXIAL CONNECTORS MOUNTED BACK-TO-BACK ON BACKPLANE

BACKGROUND OF THE INVENTION

The present invention generally pertains to coaxial connectors and is particularly directed to connecting coaxial connectors that are disposed at opposite sides of a backplane.

It is desired to pass high-frequency signals (on the order of 1.5 GHz) with low distortion between a first coaxial connector that engages a printed wiring board extending from one side of a backplane and a second coaxial connector extending from the opposite side of the back plane.

SUMMARY OF THE INVENTION

In accordance with the present invention a low-distortion connection between two coaxial connectors disposed at opposite sides of a backplane is obtained by mounting the two coaxial connectors back-to-back on opposite sides of the backplane so that respective conductive center pins of the two coaxial connectors are connected to each other along a common axis within a waveguide defined by a conductive-material-coated hole through the backplane and by impedance matching the hole to the two coaxial connectors.

More specifically, the present invention provides in combination: a backplane, a first coaxial connector mounted on one side of the backplane and a second coaxial connector mounted on an opposite side of the backplane, wherein the first coaxial connector and the second coaxial connector are mounted back-to-back with a conductive center pin of the first coaxial connector being connected to a conductive center pin of the second coaxial connector within a hole through the backplane and along a center axis of said hole; wherein the backplane includes conductive layers adjacent the hole on opposite sides of the backplane, each of the coaxial connectors includes a conductive outer casing that is connected to the conductive layer that is adjacent the hole on a respective opposite side of the backplane, and the entire hole is coated with conductive material between the conductive layers on the opposite sides of the backplane to define a waveguide between the respective conductive outer casings of the first and second coaxial connectors; and wherein the hole is dimensioned to impedance match the first and second coaxial connectors.

In one aspect of the present invention, a first coaxial connector, such as a DIN connector, has a conductive, press-fit, center pin and a second coaxial connector, such as a BNC connector, that is mounted back-to-back with the first coaxial connector on the opposite side of a backplane also has a conductive, press-fit, center pin. However, an adapter for directly connecting one press-fit coaxial connector back-to-back with another press-fit coaxial connector is not known to exist. According to this aspect of the present invention, there is provided in combination: a backplane, a first coaxial connector mounted on one side of the backplane and a second coaxial connector mounted on an opposite side of the backplane, wherein the first coaxial connector has a conductive, press-fit, center pin; wherein the first coaxial connector and the second coaxial connector are mounted back-to-back with the press-fit center pin of the first coaxial connector being connected directly to a conductive center pin of the second coaxial connector through a hole in the backplane; and wherein a portion of the center pin of the second coaxial connector that is connected directly to the center pin of the first coaxial connector is adapted for conductive engagement with the center pin of the first coaxial connector when the first and second coaxial connectors are mounted back-to back. The first coaxial connector may be a DIN press-fit coaxial connector and the second coaxial connector may be a BNC coaxial connector in which the center pin is replaced by a center pin that is adapted for conductive engagement with the center pin of the first coaxial connector when the first and second coaxial connectors are mounted back-to back.

Accordingly, the present invention further provides a coaxial connector adapted for mounting on a backplane and having a center pin dimensioned for extending into a hole through the backplane when the coaxial connector is mounted on one side of the backplane, wherein a portion of the center pin is adapted for conductive press-fit engagement with a conductive, press-fit, center pin of another coaxial connector within the hole of the backplane to enable the coaxial connectors to be connected back-to back.

In addition, the present invention provides a backplane for mounting a first coaxial connector back-to-back with a second coaxial connector, wherein the backplane includes a hole for receiving a conductive, press-fit, center pin of a first coaxial connector and a conductive center pin of a second coaxial connector when said center pins are connected directly to each other through the hole by mounting the first and second coaxial connectors back-to-back on opposite sides of the hole; wherein the backplane includes conductive layers adjacent the hole on opposite sides of the backplane; and wherein the backplane includes a first set of apertures for receiving a set of conductive mounting pins that extend from a conductive outer casing of the first coaxial connector and connect the outer casing of the first coaxial connector directly to the conductive layer on one side of the backplane when received in the first set of apertures, and a separate second set of apertures for receiving a set of conductive mounting pins that extend from a conductive outer casing of the second coaxial connector and connect the outer casing of the second coaxial connector directly to the conductive layer on the opposite side of the backplane when received in the second set of apertures. In a preferred embodiment, the entire hole is coated with conductive material to define a waveguide between the conductive layers on the opposite sides of the backplane.

Additional features of the present invention are described with reference to the detailed description of the preferred embodiments.

DETAILED DESCRIPTION

Figure 1:
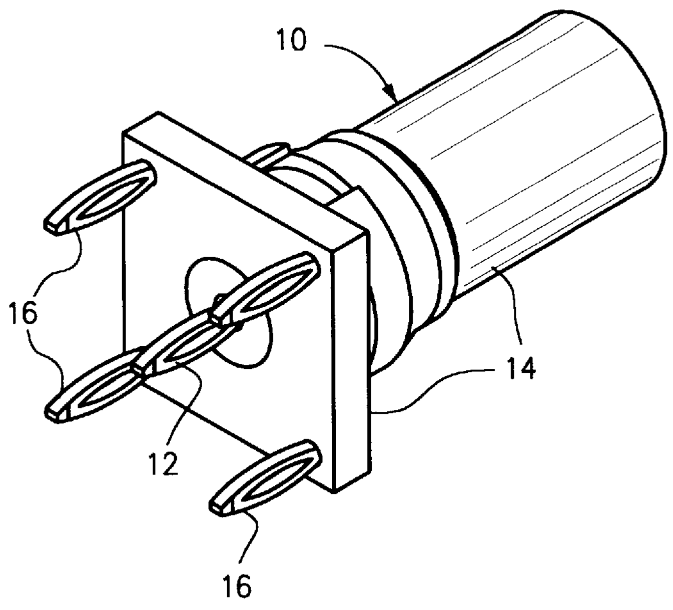
FIG. 1 PRIOR ART
FIG. 1 is a perspective view of a prior art coaxial connector having a conductive, press-fit, center pin.

Referring to FIG. 1, one of the coaxial connectors that is mounted back-to-back on a backplane with another coaxial connector in a preferred embodiment of the present invention is a prior art DIN press-fit coaxial connector 10, such as prototype part No. SK68JR102-1 obtained from Berg Electronics, Franklin, Ind. The DIN coaxial connector 10 includes an axially disposed conductive, press-fit, center pin 12, a conductive outer casing 14, and a set of conductive mounting pins 16 extending parallel to the center pin 12 from the conductive outer casing 14.

Figure 2:
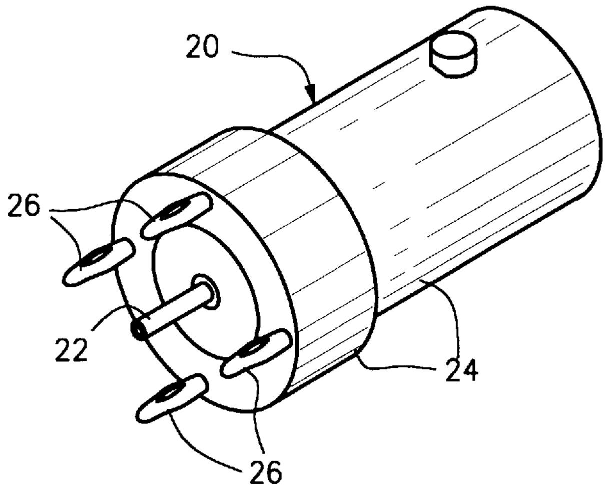
FIG. 2 is a perspective view of a coaxial connector having a conductive center pin that is adapted in accordance with the present invention for conductive engagement with the press-fit center pin of the coaxial connector of FIG. 1 when the coaxial connectors are mounted back-to back.
Figure 2A:
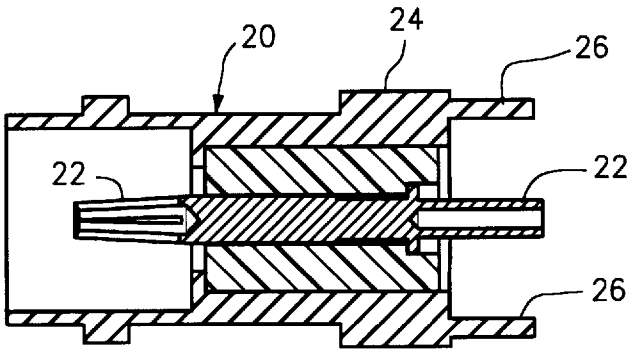
FIG. 2A is a sectional view of the coaxial connector of FIG. 2.

Referring to FIGS. 2 and 2A, the coaxial connector 20 that is mounted back-to-back on the backplane with the coaxial connector 10 shown in FIG. 1 in the preferred embodiment of the present invention is a modified version of a BNC coaxial connector bearing part No. 222462-1 obtained from AMP, Inc. The modified BNC coaxial connector 20 includes an axially disposed conductive center pin 22, a conductive outer casing 24, and a set of conductive mounting pins 26 extending parallel to the center pin 22 from the conductive outer casing 24. The portion of the center pin 22 that is connected directly to the center pin 12 of the DIN press-fit coaxial connector 10 is adapted for conductive engagement with the center pin 12 of the DIN press-fit coaxial connector 10 when the two coaxial connectors 10, 20 are mounted back-to-back along the same linear axis.

Figure 3:
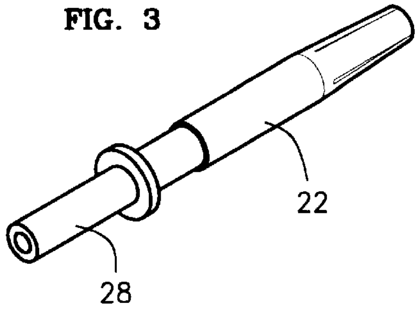
FIG. 3 is a perspective view of the center pin included in the coaxial connector of FIG. 2.

Referring to FIG. 3, it is seen that in the preferred embodiment of the center pin 22 of the modified BNC coaxial connector 20, the portion thereof that is connected directly to the center pin 12 of the DIN press-fit coaxial connector 10 is a hollow cylinder 28 that is dimensioned for connection to the center pin 12 of the DIN press-fit coaxial connector 10 by press-fit engagement. In other respects the preferred embodiment of the center pin 22 of the modified BNC coaxial connector 20 is the same as in an unmodified BNC press-fit coaxial connector.

In one alternative embodiment (not shown) of the center pin of the modified BNC coaxial connector, the portion thereof that is connected directly to the center pin of the DIN press-fit coaxial connector is a hollow cylinder that is not dimensioned for connection to the center pin of the DIN press-fit coaxial connector by press-fit engagement, but rather includes conductive grease for effecting a conductive engagement with the center pin of the DIN press-fit coaxial connector when the two coaxial connectors are mounted back-to-back.

In another alternative embodiment (not shown) of the center pin of the modified BNC coaxial connector, the portion thereof that is connected directly to the center pin of the DIN press-fit coaxial connector is not hollow, but is shaped in a different manner for effecting a conductive engagement with the center pin of the DIN press-fit coaxial connector when the two coaxial connectors are mounted back-to-back.

Figure 4:
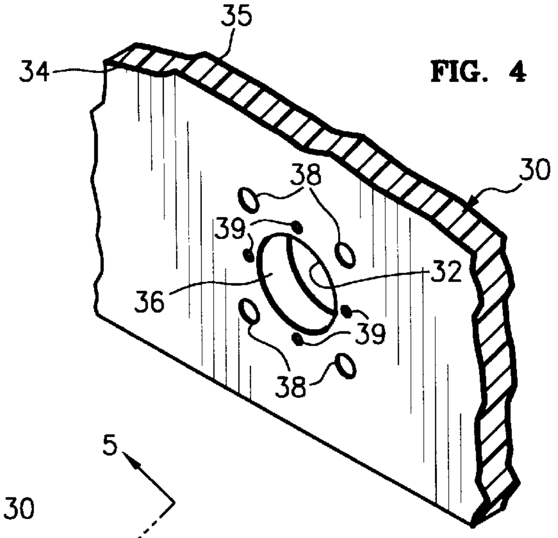
FIG. 4 is a perspective view of a portion of a backplane on which the coaxial connectors of FIGS. 1 and 2 can be mounted back-to-back in accordance with the present invention.
Figure 4A:
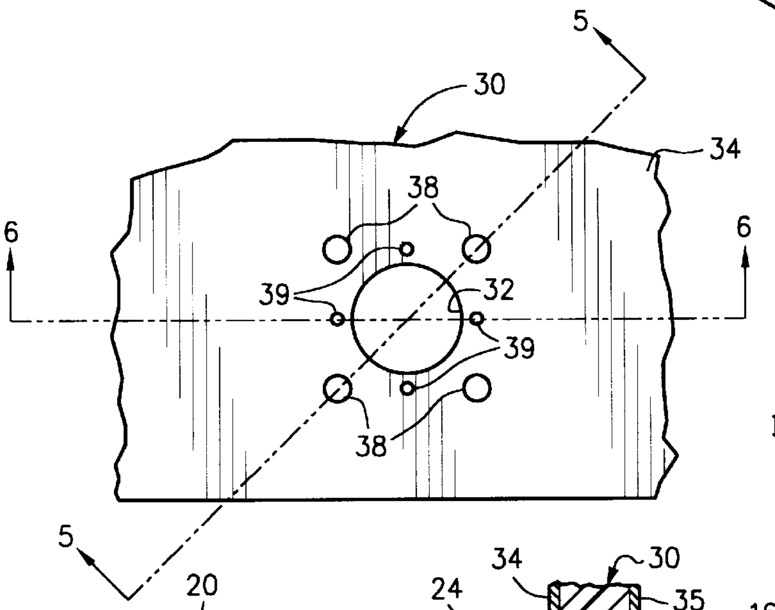
FIG. 4A is a top plan view of the portion of a backplane shown in FIG. 4.

Referring to FIGS. 4 and 4A, a backplane 30 for mounting the DIN press-fit coaxial connector 10 back-to-back along the same linear axis with the modified BNC coaxial connector 22 includes a cylindrical center hole 32 for receiving the conductive, press-fit, center pin 12 of the DIN press-fit coaxial connector 10 and the conductive center pin 22 of the modified BNC coaxial connector 20 when the respective center pins 12, 22 are connected directly to each other through the center hole 32 by mounting the DIN press-fit coaxial connector 10 and the modified BNC coaxial connector 20 back-to-back on opposite sides of the center hole 32. The hole is empty and thereby has the dielectric constant of air. The backplane 30 includes conductive layers 34, 35 adjacent the center hole 32 on opposite sides of the backplane 30, and the entire center hole 32 is coated with a conductive material 36, such as copper, between the conductive layers 34, 35 on the opposite sides of the backplane 30 to provide a waveguide between the conductive outer casing 14 of the DIN press-fit coaxial connector 10 and the conductive outer casing 24 of the modified BNC coaxial connector 20.

Figure 5:
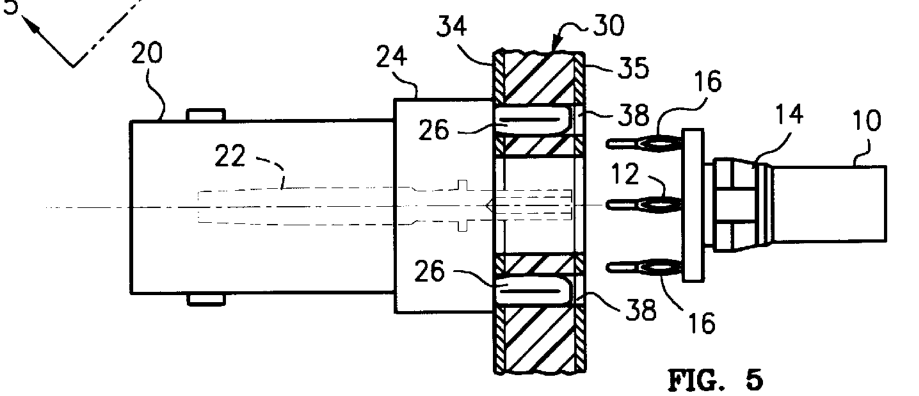
FIG. 5 is a sectional view taken along lines 5—5 of FIG. 4A showing the coaxial connector of FIG. 2 mounted on one side of the backplane of FIG. 4 and the coaxial connector of FIG. 1 positioned for being mounted on the opposite side of the backplane.

The backplane 30 includes a first set of apertures 38 for receiving the set of conductive mounting pins 26 that extend from the conductive outer casing 24 of the modified BNC coaxial connector 20, as shown in FIG. 5. When this set of conductive mounting pins 26 are received in the first set of apertures 38, this set of conductive mounting pins 26 connect the conductive outer casing 24 of the modified BNC coaxial connector 20 directly to the conductive layer 34 on one side of the backplane 30.

Figure 6:
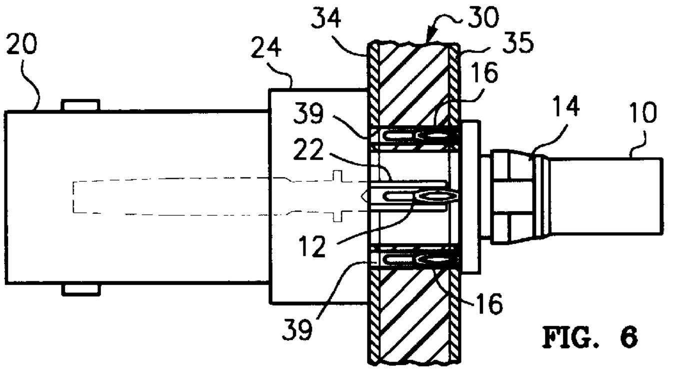
FIG. 6 is a sectional view taken along lines 6—6 of FIG. 4A showing the coaxial connectors of FIGS. 1 and 2 mounted back-to-back on opposite sides of the backplane of FIG. 4 in accordance with the present invention.

The backplane 30 also includes a separate second set of apertures 39 for receiving the set of conductive mounting pins 16 that extend from the conductive outer casing 14 of the DIN press-fit coaxial connector 10, as shown in FIG. 6. When this set of conductive mounting pins 16 are received in the second set of apertures 39, this set of conductive mounting pins 16 connect the conductive outer casing 14 of the DIN press-fit coaxial connector 10 directly to the conductive layer 35 on the opposite side of the backplane 30.

FIG. 6 shows the DIN press-fit coaxial connector 10 of FIG. 1 and the modified BNC coaxial connector 20 of FIGS. 2 and 2A mounted back-to-back on opposite sides of the backplane 30 of FIG. 4 in accordance with a preferred embodiment of the present invention, with the respective conductive center pins 12, 22 of the two coaxial connectors 10, 20 aligned along the same linear axis and in conductive press-fit engagement with each other within the center hole 32 of the backplane 30.

The diameter of the center hole 32 is dimensioned in relation to the outside diameter of the cylindrical hollow portion 28 of the center pin 22 of the modified BNC coaxial connector 20 that is connected directly to the center pin 12 of the DIN press-fit coaxial connector to impedance match the connection between the modified BNC coaxial connector 20 and the DIN press-fit coaxial connector 10 in accordance with the following equation:

$$Z=[60\div(e)-\tfrac{1}{2}]\times 1n(b/a) \qquad \text{(Eq. 1)}$$

wherein e is the dielectric constant within the center hole 32, a is the outside diameter of the hollow cylinder 28 of the conductive center pin 22 of the modified BNC coaxial connector 20, and b is the diameter of the center hole 32.

Except for the two center pins 12, 22, the center hole 32 is empty and thereby has the dielectric constant of air, which is one and thereby minimizes the necessary diameter of the center hole 32. For higher impedances, such minimization may enable the diameter of the center hole 32 to be small enough that the first and second sets of apertures 38, 39 can be disposed in the backplane 30 outside the boundary of the center hole 32 for receiving the respective sets of mounting pins 12, 22 of the DIN press-fit coaxial connector 10 and the modified BNC coaxial connector 20.

The combination of the DIN press-fit coaxial connector 10 and the modified BNC coaxial connector 20 mounted back-to-back on opposite sides of the backplane 30 along the same linear axis, as shown in FIG. 6, enables high-frequency signals to be passed directly with low distortion between such a DIN press-fit connector 10 that engages a printed wiring board (not shown) extending from one side of the backplane 30 and such a modified BNC connector 20 that extends from the opposite side of the back plane 30.

The advantages specifically stated herein do not necessarily apply to every conceivable embodiment of the present invention. Further, such stated advantages of the present invention are only examples and should not be construed as the only advantages of the present invention.

While the above description contains many specificities, these should not be construed as limitations on the scope of the present invention, but rather as examples of the preferred embodiments described herein. Other variations are possible and the scope of the present invention should be determined not by the embodiments described herein but rather by the claims and their legal equivalents.

I claim:

1. In combination: a backplane, a first coaxial connector mounted on one side of the backplane and a second coaxial connector mounted on an opposite side of the backplane, wherein the first coaxial connector and the second coaxial connector are mounted back-to-back with a conductive center pin of the first coaxial connector being connected to a conductive center pin of the second coaxial connector within a hole through the backplane and along a center axis of said hole;

wherein the backplane includes conductive layers adjacent the hole on opposite sides of the backplane, each of the coaxial connectors includes a conductive outer casing that is connected to the conductive layer that is adjacent the hole on a respective opposite side of the backplane, and the entire hole is coated with conductive material between the conductive layers on the opposite sides of the backplane to define a waveguide between the respective conductive outer casings of the first and second coaxial connectors; and wherein the hole is dimensioned to impedance match the first and second coaxial connectors.

2. A combination according to claim 1, wherein each of the coaxial connectors includes a set of conductive mounting pins extending from the conductive outer casing and connecting the outer casing to the respective conductive layer of the backplane; and wherein the backplane includes two sets of apertures that respectively receive the two sets of mounting pins.

3. A combination according to claim 1, wherein, except for the pins, the hole is empty and thereby has the dielectric constant of air.

4. A combination according to claim 3, wherein each of the coaxial connectors includes a set of conductive mounting pins extending from the conductive outer casing and connecting the outer casing to the respective conductive layer of the backplane; and wherein the backplane includes two sets of apertures that respectively receive the two sets of mounting pins.

5. In combination: a backplane, a first coaxial connector mounted on one side of the backplane and a second coaxial connector mounted on an opposite side of the backplane, wherein the first coaxial connector has a conductive, press-fit, center pin;

wherein the first coaxial connector and the second coaxial connector are mounted back-to-back with the press-fit center pin of the first coaxial connector being connected directly to a conductive center pin of the second coaxial connector through a hole in the backplane; and wherein a portion of the center pin of the second coaxial connector that is connected directly to the center pin of the first coaxial connector is adapted for conductive engagement with the center pin of the first coaxial connector when the first and second coaxial connectors are mounted back-to-back.

6. A combination according to claim 5, wherein the portion of the center pin of the second coaxial connector that is connected directly to the center pin of the first coaxial connector is hollow and connected to the center pin of the first coaxial connector by press-fit engagement.

7. A combination according to claim 5, wherein the portion of the center pin of the second coaxial connector that is connected directly to the center pin of the first coaxial connector is hollow.

8. A combination according to claim 7, wherein the hole and the portion of the center pin of the second coaxial connector that is connected directly to the center pin of the first coaxial connector are cylindrical;

wherein the backplane includes conductive layers adjacent the hole on opposite sides of the backplane, each of the coaxial connectors includes a conductive outer casing that is connected to the conductive layer that is adjacent the hole on a respective opposite side of the backplane, and the entire hole is coated with conductive material between the conductive layers on the opposite sides of the backplane to define a waveguide between the respective conductive outer casings of the first and second coaxial connectors; and wherein the diameter of the hole is dimensioned in relation to the outside diameter of the portion of the center pin of the second coaxial connector that is connected directly to the center pin of the first coaxial connector to impedance match the first and second coaxial connectors.

9. A combination according to claim 8, wherein, except for the pins, the hole is empty and thereby has the dielectric constant of air.

10. A combination according to claim 9, wherein each of the coaxial connectors includes a set of conductive mounting pins extending from the conductive outer casing and connecting the outer casing to the respective conductive layer of the backplane; and wherein the backplane includes two sets of apertures that respectively receive the two sets of mounting pins.

11. A combination according to claim 5, wherein the backplane includes conductive layers adjacent the hole on opposite sides of the backplane, each of the coaxial connectors includes a conductive outer casing that is connected to the conductive layer that is adjacent the hole on a respective opposite side of the backplane, and the entire hole is coated with conductive material between the conductive layers on the opposite sides of the backplane to define a waveguide between the respective conductive outer casings of the first and second coaxial connectors; and wherein the hole is dimensioned to impedance match the first and second coaxial connectors.

12. A combination according to claim 11, wherein, except for the pins, the hole is empty and thereby has the dielectric constant of air.

13. A backplane for mounting a first coaxial connector back-to-back with a second coaxial connector, wherein the backplane includes a hole for receiving a conductive, press-fit, center pin of a first coaxial connector and a conductive center pin of a second coaxial connector when said center pins are connected directly to each other through the hole by mounting the first and second coaxial connectors back-to-back on opposite sides of the hole;

wherein the backplane includes conductive layers adjacent the hole on opposite sides of the backplane; and wherein the backplane includes a first set of apertures for receiving a set of conductive mounting pins that extend from a conductive outer casing of the first coaxial connector and connect the outer casing of the first coaxial connector directly to the conductive layer on one side of the backplane when received in the first set of apertures, and a separate second set of apertures for receiving a set of conductive mounting pins that extend from a conductive outer casing of the second coaxial connector and connect the outer casing of the second coaxial connector directly to the conductive layer on the opposite side of the backplane when received in the second set of apertures.

14. A backplane according to claim 13, wherein the entire hole is coated with conductive material between the conductive layers on the opposite sides of the backplane.

15. A backplane according to claim 14, wherein the hole is cylindrical.

16. A backplane according to claim 14, wherein the hole is empty and thereby has the dielectric constant of air.

17. A backplane according to claim 16, wherein the hole is cylindrical.

* * * * *